(12) United States Patent
Laude et al.

(10) Patent No.: US 9,185,810 B2
(45) Date of Patent: *Nov. 10, 2015

(54) MOLDED POLYMER COMPRISING SILICONE AND AT LEAST ONE METAL TRACE AND A PROCESS OF MANUFACTURING THE SAME

(75) Inventors: Lucien D. Laude, Rabastens-de-Bigorre (FR); Robert J. Greenberg, Los Angeles, CA (US)

(73) Assignee: Second Sight Medical Products, Inc., Sylmar, CA (US)

(*) Notice: Subject to any disclaimer, the term of this patent is extended or adjusted under 35 U.S.C. 154(b) by 1628 days.

This patent is subject to a terminal disclaimer.

(21) Appl. No.: 11/924,752

(22) Filed: Oct. 26, 2007

(65) Prior Publication Data

US 2008/0044591 A1    Feb. 21, 2008

Related U.S. Application Data

(62) Division of application No. 11/810,758, filed on Jun. 6, 2007, now Pat. No. 7,749,608.

(60) Provisional application No. 60/811,494, filed on Jun. 6, 2006, provisional application No. 60/811,683, filed on Jun. 7, 2006.

(51) Int. Cl.
*B29D 11/00* (2006.01)
*B05D 3/06* (2006.01)
(Continued)

(52) U.S. Cl.
CPC ............ *H05K 3/185* (2013.01); *C23C 18/1612* (2013.01); *C23C 18/1639* (2013.01);
(Continued)

(58) Field of Classification Search
CPC .......... C25D 5/02; C25D 5/56; H05K 3/0014; H05K 3/0026; H05K 3/0032; H05K 3/0038; H05K 3/181; H05K 3/182; H05K 3/185; H05K 3/28; H05K 3/285; H05K 3/381; H05K 3/421; H05K 3/422; H05K 3/429; H05K 3/4661; H05K 2201/0112; H05K 2201/0162; H05K 2201/09509–2201/09545; H05K 1/032; H05K 1/0326; H05K 1/0353; H05K 1/0393; C23C 18/1608; C23C 18/1612; C23C 18/1639; C23C 18/1641; C23C 18/165; C23C 18/1651; C23C 18/1653; C23C 18/1692; C23C 18/1868; C23C 18/204
USPC ................ 427/554, 555, 581, 162, 164, 2.24, 427/2.31, 96.2–96.6, 97.1–98.6, 99.1–99.5; 264/401, 1.32–1.38, 1.7–1.9, 400, 241, 264/248, 259–270, 294, 299–308; 216/65, 216/66, 87, 94

See application file for complete search history.

(56) References Cited

U.S. PATENT DOCUMENTS 4,826,583 A * 5/1989 Biernaux et al. .......... 204/224 R
4,865,873 A * 9/1989 Cole et al. .................... 427/555

(Continued)

FOREIGN PATENT DOCUMENTS

EP    0 442 674 A2    8/1991

OTHER PUBLICATIONS

Webster's Ninth New Collegiate Dictionary; Merriam-Webster's incorporated, publishers; Springfield, Massachusetts, USA; 1990 (no month); excerpts pp. 271, 287, 564, 898-899, 1068-1070 & 1134-1135.*

(Continued)

*Primary Examiner* — Marianne L Padgett
(74) *Attorney, Agent, or Firm* — Scott B. Dunbar; Gary Schnittgrund

(57) ABSTRACT

The invention is a method of making a flexible electrode array, comprising a silicone containing body, a metal trace layer and an electrode pad on the surface, including the steps of irradiating a surface area of a molded silicone containing layer yielding traces with the light beam from a pulsed ultraviolet laser source; immersing said irradiated molded silicone layer for inducing the deposit of metal ions to form metal traces; applying a silicone containing layer on the silicone containing layer and the metal traces; irradiating the surface for drilling holes in the molded silicone containing layer; and immersing the irradiated molded silicone layer for inducing the deposit of metal ions to form metal electrode pads.

9 Claims, 11 Drawing Sheets

(51) Int. Cl.
      B05D 5/12    (2006.01)
      H05K 3/18    (2006.01)
      C25D 5/02    (2006.01)
      C25D 5/56    (2006.01)
      C23C 18/16   (2006.01)
      C23C 18/18   (2006.01)
      C23C 18/20   (2006.01)
      H05K 1/03    (2006.01)
      H05K 3/00    (2006.01)
      H05K 3/28    (2006.01)
      H05K 3/42    (2006.01)
      H05K 3/46    (2006.01)

(52) U.S. Cl.
      CPC ......... *C23C18/1641* (2013.01); *C23C 18/1692*
            (2013.01); *C23C 18/1868* (2013.01); *C23C*
            *18/204* (2013.01); *C25D 5/02* (2013.01); *C25D*
            *5/56* (2013.01); *H05K 1/032* (2013.01); *H05K*
            *1/0393* (2013.01); *H05K 3/0035* (2013.01);
            *H05K 3/28* (2013.01); *H05K 3/421* (2013.01);
            *H05K 3/4661* (2013.01); *H05K 2201/0162*
                                                    (2013.01)

(56) References Cited

U.S. PATENT DOCUMENTS

| | | | | |
|---|---|---|---|---|
| 4,960,613 | A * | 10/1990 | Cole et al. | 427/555 |
| 5,109,844 | A   | 5/1992  | de Juan, Jr. et al. | |
| 5,215,801 | A * | 6/1993  | Wong | 428/76 |
| 5,314,709 | A * | 5/1994  | Doany et al. | 427/555 |
| 5,505,201 | A * | 4/1996  | Grill et al. | 600/371 |
| 5,599,592 | A   | 2/1997  | Laude | |
| 5,935,155 | A   | 8/1999  | Humayun et al. | |
| 6,400,989 | B1  | 6/2002  | Eckmiller | |
| 6,458,157 | B1  | 10/2002 | Suaning | |
| 6,743,345 | B2  | 6/2004  | Belouet et al. | |
| 6,878,643 | B2  | 4/2005  | Krulevitch et al. | |
| 7,033,648 | B1* | 4/2006  | Doany et al. | 427/537 |
| 8,603,590 | B2* | 12/2013 | Laude et al. | 427/555 |
| 9,044,591 | B2* | 6/2015  | Greenberg et al. | 1/1 |
| 2003/0116872 | A1* | 6/2003 | Klemm et al. | 264/1.31 |
| 2003/0122269 | A1* | 7/2003 | Weber et al. | 264/1.31 |
| 2004/0018297 | A1  | 1/2004 | Davidson et al. | |
| 2004/0121528 | A1  | 6/2004 | Krulevitch et al. | |
| 2008/0069971 | A1* | 3/2008 | Keersmaecker et al. | 427/555 |
| 2008/0305320 | A1* | 12/2008 | Laude et al. | 428/318.4 |
| 2010/0323297 | A1* | 12/2010 | Yanagisawa | 430/315 |
| 2011/0155428 | A1* | 6/2011 | Tseng et al. | 174/257 |
| 2014/0115885 | A1* | 5/2014 | Greenberg et al. | 29/829 |

OTHER PUBLICATIONS

Fertigungstechnik: Folie Als Umweltfreundliche Leiterplatten—Alternative Weka Fachzeitschriftenverlag, Poing de vol. 49, No. 11, May 2000, p. 30 (in German).

M. Maghribi, et al., Stretchable Micro-Electrode Array, 2nd Annual Int. IEEE-EMBS Special Topic Conf. on Microtechnologies in Med. & Biology, (May 2002) Madison, WI, pp. 80-83.

V. Vince, et al., Biocompatibility of Platinum-Metalized Silicone Rubber: in Vivo and in Vitro Evaluation, J. Biomater. Sci. Polymer Edn. 2004, pp. 173-188, vol. 15, No. 2.

L.D. Laude, et al., Laser Metallization for Microelectronics and Bio-Applications, Photon Processing in Microelectronics and Photonics, 11, 2003, pp. 578-586, SPIE, vol. 4977.

\* cited by examiner

FIG. 1-1
1 
2 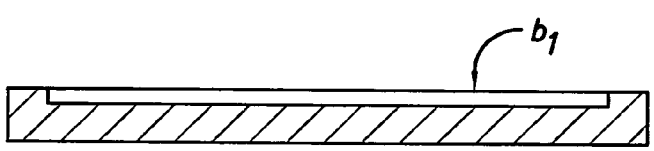
3 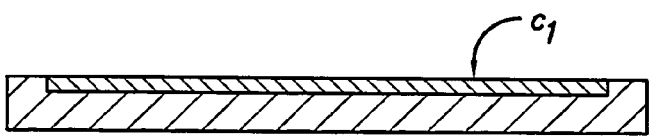
4 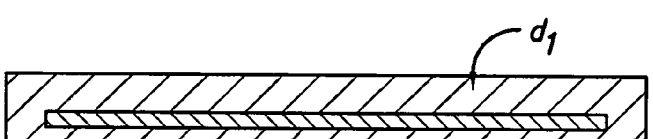
5 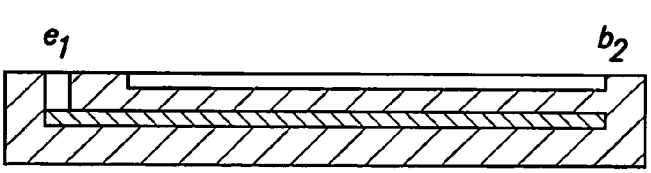
6 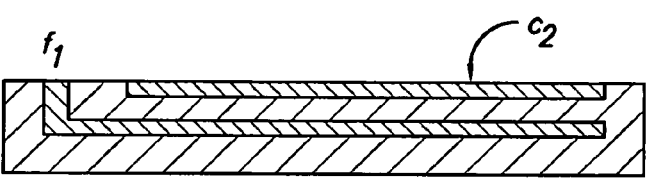
7 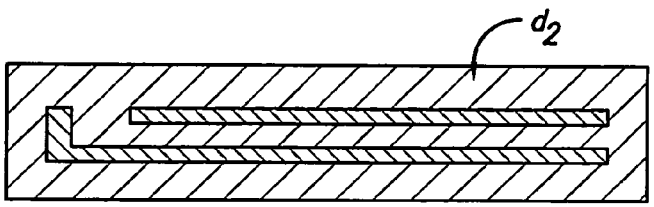
8 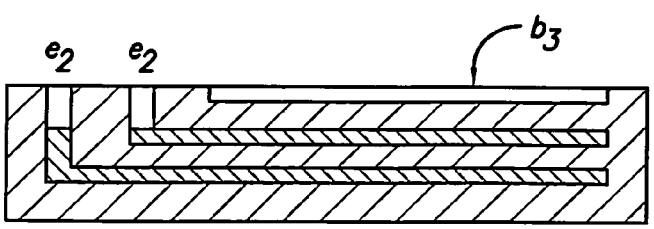

FIG. 1-3
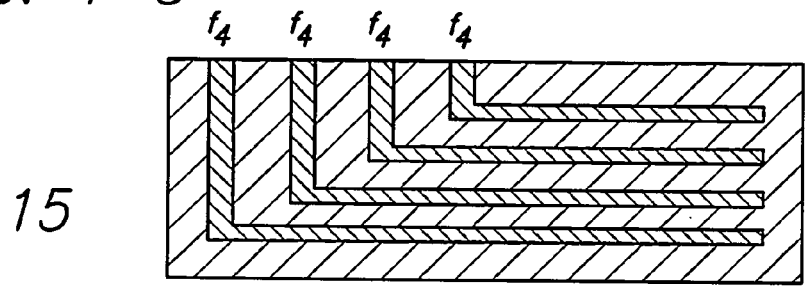
15
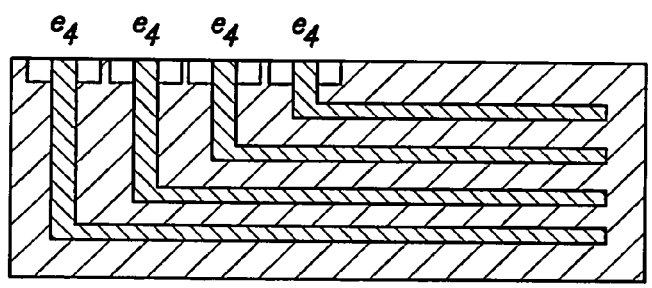
16
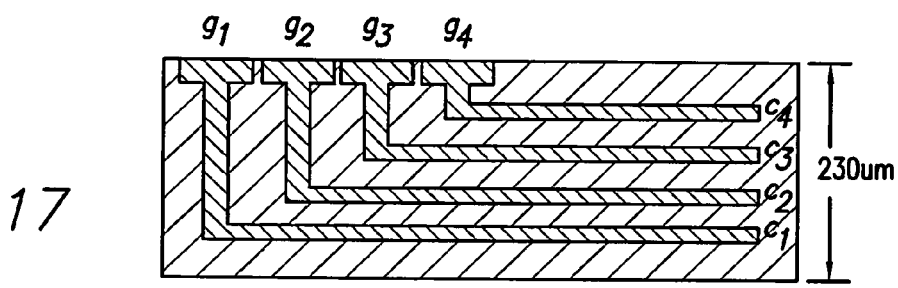
17
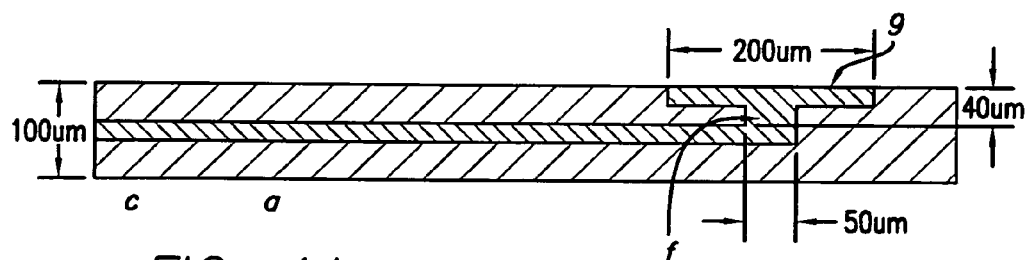
FIG. 1A

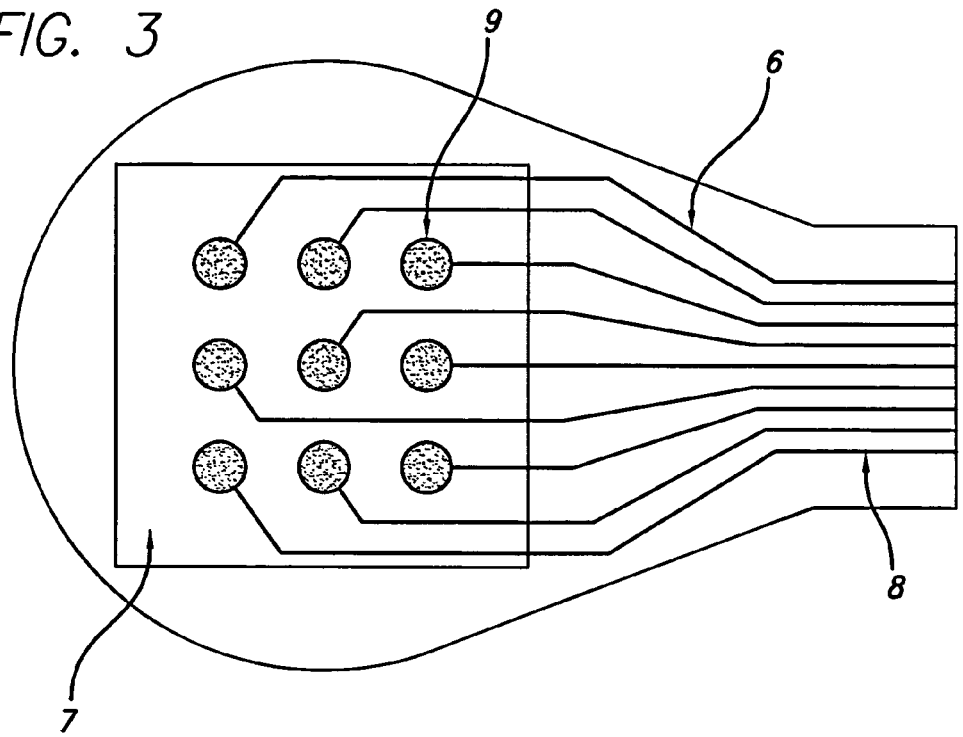
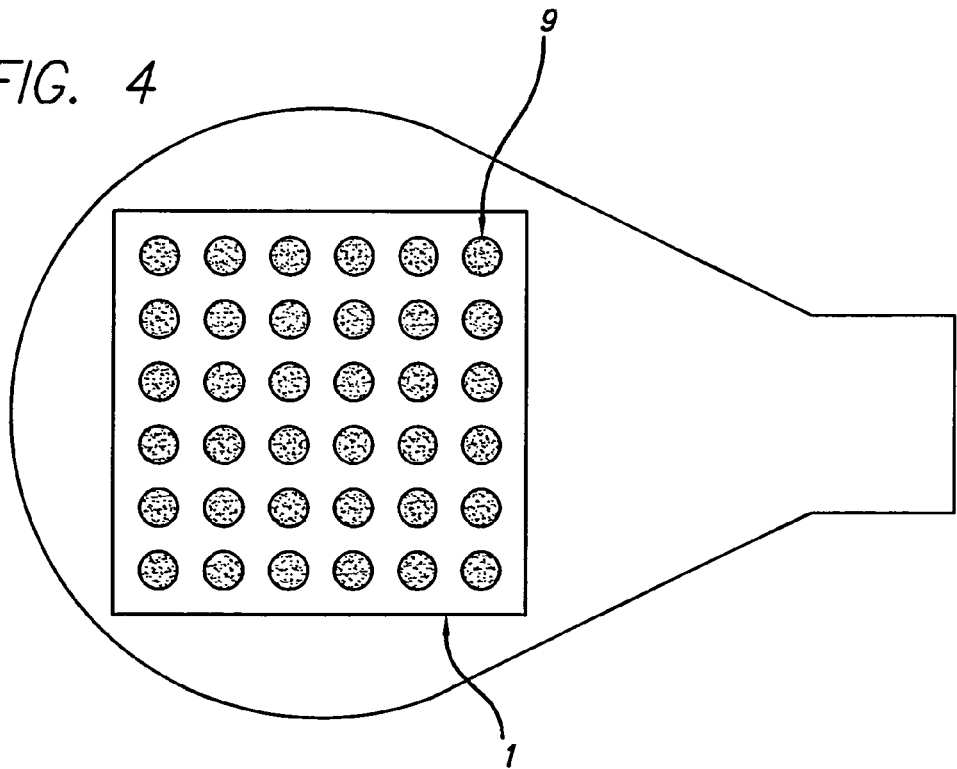

FIG. 6
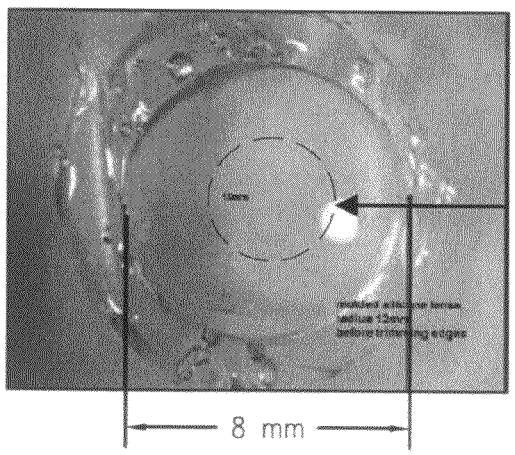
FIG. 7
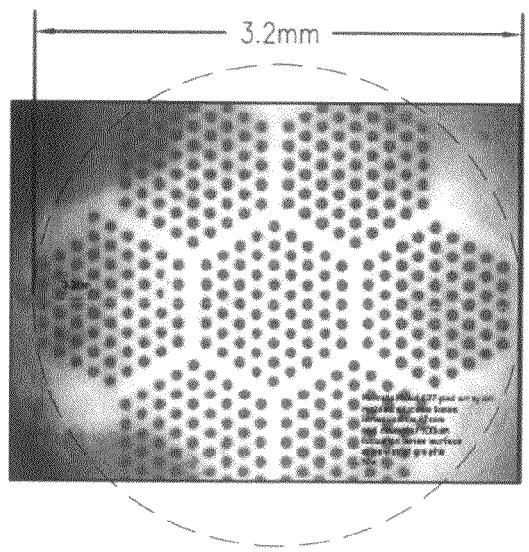
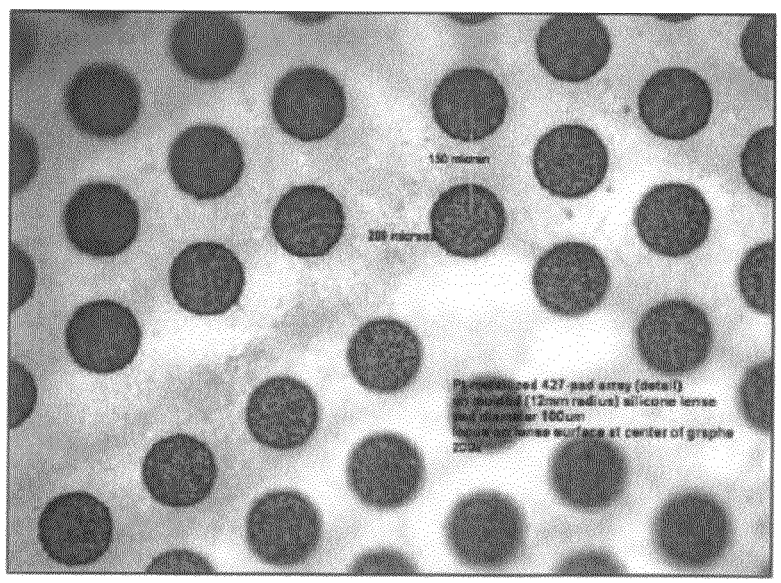
FIG. 7A

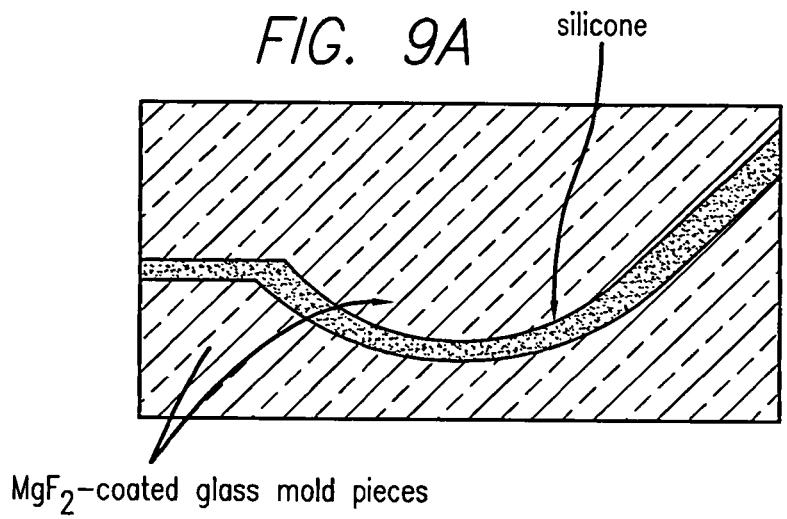
FIG. 9A
silicone
MgF2-coated glass mold pieces
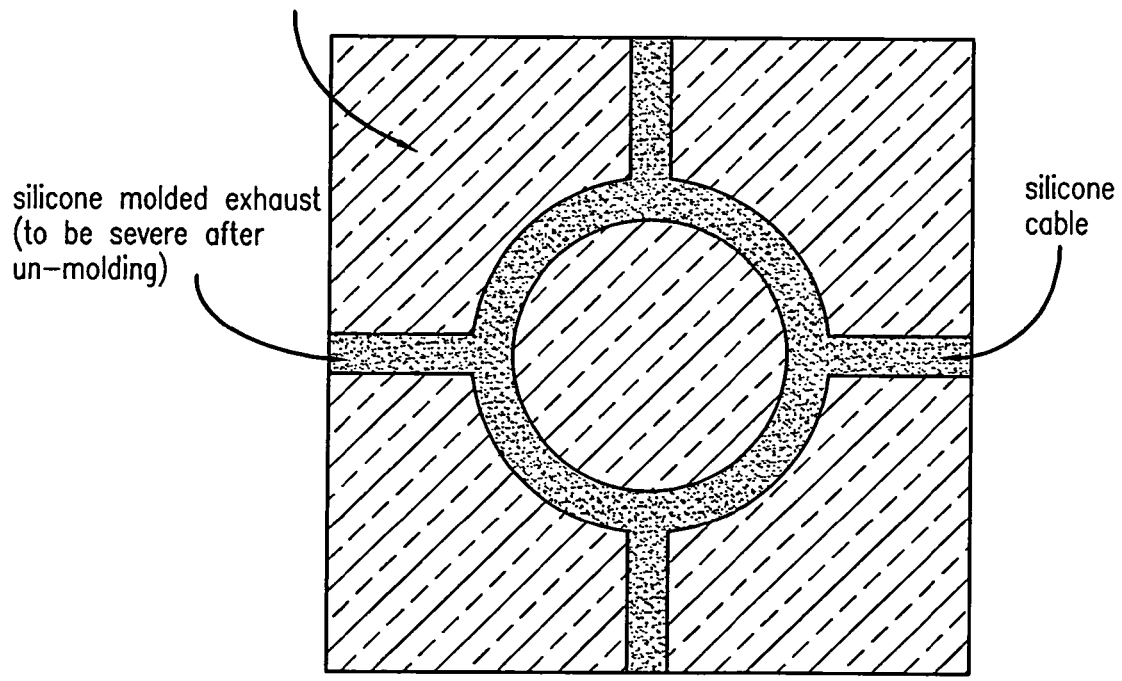
MgF2-coated glass mold pieces  FIG. 9B
silicone molded exhaust (to be severe after un-molding)
silicone cable

MOLDED POLYMER COMPRISING SILICONE AND AT LEAST ONE METAL TRACE AND A PROCESS OF MANUFACTURING THE SAME

CROSS-REFERENCE TO RELATED APPLICATIONS

This application is a divisional of application Ser. No. 11/810,758, entitled "Molded Polymer Comprising Silicone and at Least One Metal Trace and a Process of Manufacturing the Same", filed Jun. 6, 2007 (now U.S. Pat. No. 7,749,608 entitled "Molded Polymer Comprising Silicone and at Least one Metal Trace", issued on Jul. 6, 2010, and which claims the benefit of provisional Application 60/811,494, "Molded Polymer Comprising Silicone and at Least One Metal Trace and a Process of Manufacturing the Same," filed Jun. 6, 2006, and which claims the benefit of provisional Application 60/811,683, "Polymer Layer Comprising Silicone and at Least One Metal Trace and a Process of Manufacturing the Same," filed Jun. 7, 2006.

BACKGROUND OF THE INVENTION

1. Field of the Invention

The present invention relates to a silicone polymer material comprising at least one metal trace and a process of manufacturing the same.

2. Description of Related Art

In U.S. Pat. No. 5,599,592 "Process for the Metallization of Polymer Materials and Products Thereto Obtained" to Lucien D. Laude a positive metallization process for metallizing a polymer composite piece containing a polymer material and oxide particles is disclosed, the oxide particles being made of one or more oxides, comprising three successive steps. The first step consists of the irradiation of a surface area of a polymer piece to be metallized with a light beam emitted by an excimer laser. The polymer piece is made from a polymer material and oxide particles. The oxide particles are made from one or more oxides. The second step consists of immersing the irradiated polymer piece in at least one autocatalytic bath containing metal ions. The immersion induces the deposit of the metal ions onto the irradiated surface area to form a metal film on the surface area, resulting in the selective metallization of the surface area of the polymer piece. The third step consists of thermally processing the metallized polymer piece to induce diffusion of the deposited metal film into the polymer material of the polymer piece. The disclosure of U.S. Pat. No. 5,599,592 is incorporated herein by reference.

Lucien D. Laude, et al. report that excimer lasers are effective tools in engraving ceramics and polymers, changing irreversibly the surface of the irradiated material, and restricting these effects to specific areas of interest. See LD. Laude, K. Kolev, C. Dicara, and C. Dupas-Bruzek, "Laser Metallization for Microelectronics for Bio-applications," Proc. of SPIE vol. 4977 (2003), pp 578-586.

In U.S. Pat. No. 5,935,155 "Visual Prosthesis and Method of Using Same" to Mark S. Humayun, et al. a visual prosthesis is disclosed comprising means for perceiving a visual image, the means producing a visual signal output in response thereto; retinal tissue stimulation means adapted to be operatively attached to a retina of a user; and wireless visual signal communication means for transmitting said visual signal output to the retinal tissue stimulation means.

In U.S. Pat. No. 6,878,643 "Electronic Unit integrated Into a Flexible Polymer Body" to Peter a. Krulevitch, et al. a method of fabricating an electronic apparatus is disclosed comprising the steps of providing a silicone layer on a matrix, providing a metal layer on said silicone layer, providing a second layer of silicone on said silicone layer, providing at least one electronic unit connected to said metal layer, and removing said electronic apparatus from said matrix wherein said silicone layer and said second layer of a silicone provide a spherical silicone body.

J. Delbeke, et al. demonstrate that silicone rubber biocompatibility is not altered by the metallization method as described by Laude in U.S. Pat. No. 5,599,592. See V. Cince, M. A. Thil, C. Veraart, I. M. Colin and J. Delbeke "Biocompatibility of platinum-metallized silicone rubber: in vivo and in vitro evaluation," *J. Biomater. Sci. Polymer Edn*, vol. 15, no. 2, pp 173-188 (2004).

There is a need and a high desire for a soft and biocompatible polymer layer with high insulation properties containing embedded very fine metal traces. There is further a need and a high desire for an economical and ecological process of manufacturing such polymer layers.

SUMMARY OF THE INVENTION

The invention is a method for embedding at least one layer of at least one metal trace in a silicone-containing polymer, comprising:
applying a polymer layer on a substrate;
thermally treating the polymer;
irradiating at least one surface area of the polymer with a light beam emitted by an excimer laser;
immersing the irradiated polymer in at least one autocatalytic bath containing ions of at least one metal, and metallizing the polymer;
thermally treating the metallized polymer;
applying a polymer layer covering the thermally treated metallized polymer; and thermally treating the metallized covered polymer.

BRIEF DESCRIPTION OF THE DRAWINGS

FIGS. 1-1, 1-2, and 1-3 depict the sequence of process steps for manufacturing 1-4 levels of metallized silicone layer body;

FIG. 1A depicts a cross-sectional view of one layer metallized silicone with a pad;

FIG. 2 depicts a cross section of visual prostheses;

FIG. 3 depicts the back view of visual prostheses as shown in FIG. 2;

FIG. 4 depicts the front view of visual prostheses as shown in FIG. 2;

FIG. 6 depicts the front view of a molded silicone;

FIG. 7 presents the front view of a molded silicone, as shown in FIG. 6, with electrodes;

FIG. 7A depicts a magnification of the metallized front view of a molded silicone, FIG. 7;

FIGS. 9A to 9F depict a sequence for manufacturing a curved metallized electrode array.

DETAILED DESCRIPTION OF THE INVENTION

Figures 1, 2:
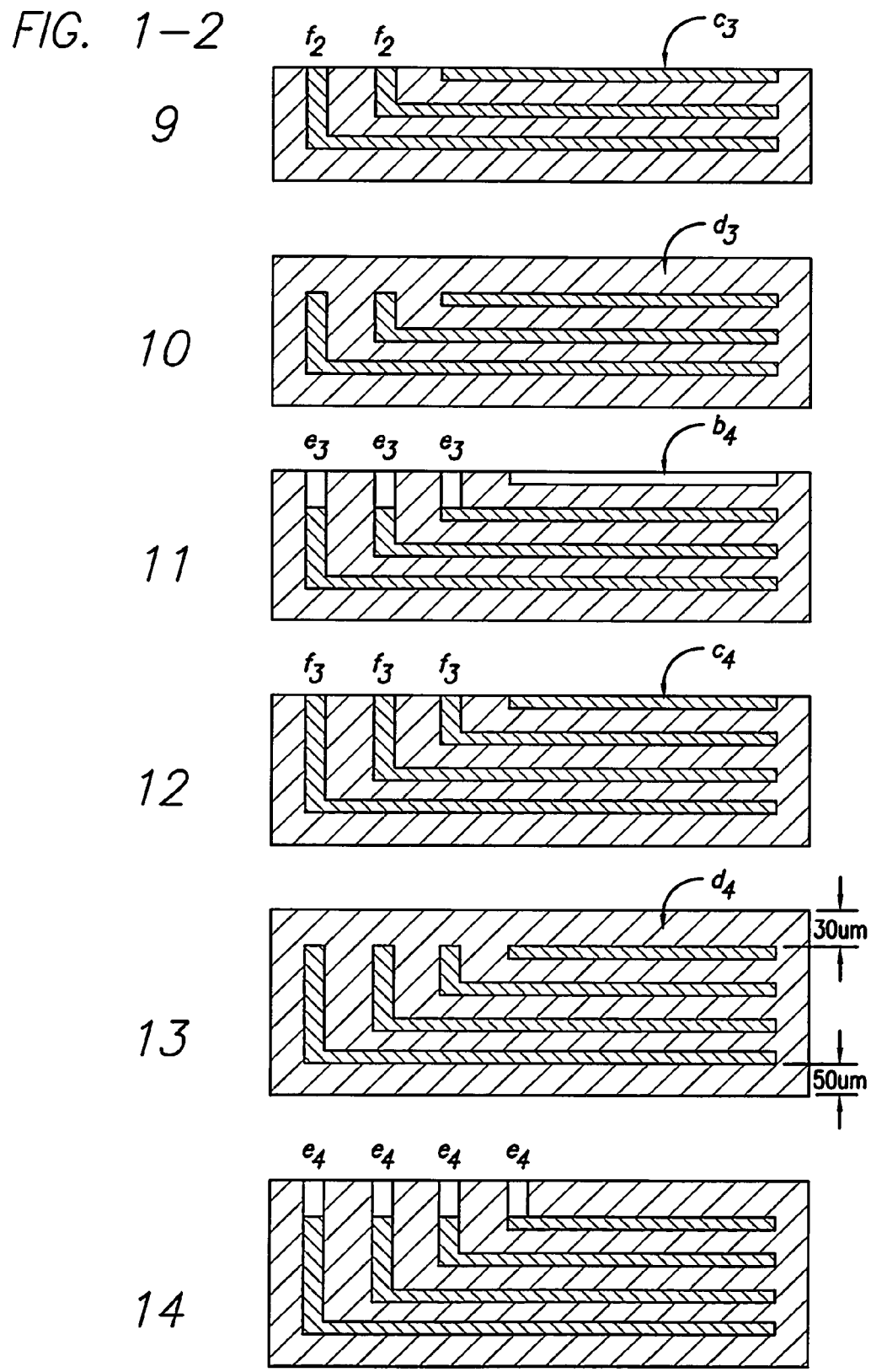
Figure 2:
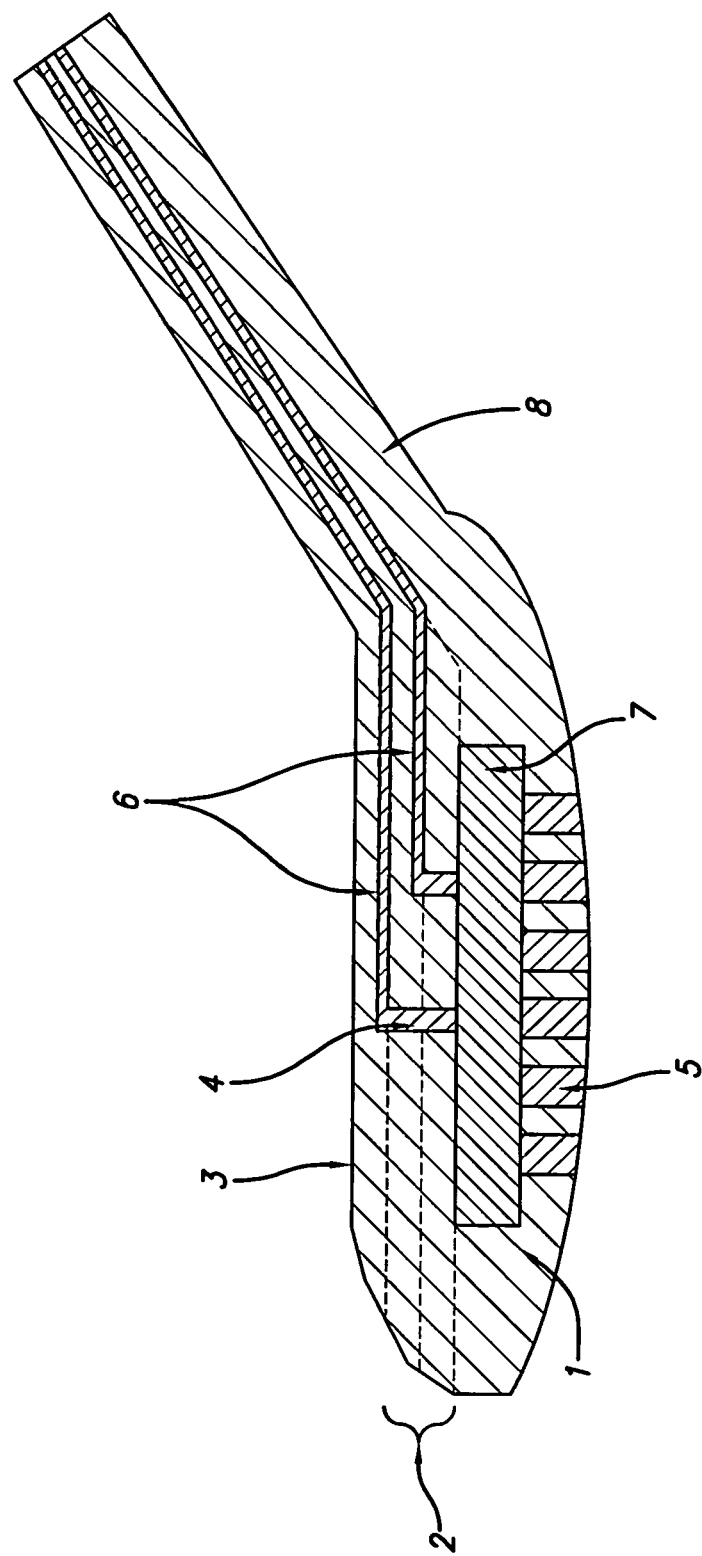

The present invention relates to the metallization of a polymer, generally Si-based polymers. A preferred embodiment of the invention is metallization of polymers with platinum. The most preferred embodiment is a polymer layer comprising at least one metal trace embedded in a polymer layer.

The preferred polymer is a silicone containing polymer. Silicone means any and all possible silicone elastomer formulations, silicone craft polymers, silicone copolymers, silicone-silicone copolymers, silicone-hydrocarbon copolymers, silicone block polymers, silicone block copolymers, silicone rubbers or mixtures thereof. Silicone may contain any type and amount of additives.

The most common method for preparing silicones involves the reaction of a chlorosilane with water. This produces a hydroxyl intermediate, which condenses to form a polymer-type structure. The basic reaction sequence is represented as follows:

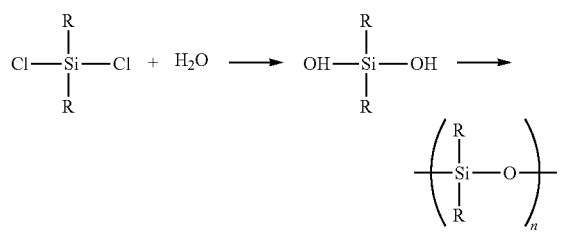

n is an integer>1.

Other raw materials such as alkoxysilanes can be used as well.

Chlorosilanes and other silicone precursors are synthesized by a direct process, involving the reaction of elemental silicone with an alkyl halide as follows:

$$Si + RX \rightarrow R_n SiX_{4-n} \text{ (where n=0-4)}$$

Silicone elastomers have high molecular weight, generally greater than 500,000 g/mol. The production of these types of materials requires di-functional precursors, which form polymer structures. Mono-functional and tri-functional precursors form terminal structures and branched structures respectively.

Silicone rubbers contain usually cured additives like peroxides such as benzoyl peroxide, 2,4-dichlorobenzoyl peroxide, t-butyl perbenzoate and dicumyl peroxide. Alkyl hydroperoxides and dialkyl peroxides have also been used successfully with vinyl containing silicones.

Hydrosilylation or hydrosilation is an alternative curing method for vinyl containing silicones and utilizes hydrosilane materials and platinum containing compounds for catalysts. It is a two part process requiring mixing of two separate components, with the resulting material having a limited shelf life. Curing does not produce volatiles. Further, heat cured conventional silicones with high tear strengths can be cured in this way.

Reinforcing fillers are added to improve the otherwise poor tensile strength of silicones. Silica, in the form of silica fume, silica foam, or fumed silica with particle sizes in the range 10 to 40 nm is the most preferred filler, although carbon black has been used. Fillers do interact with the vulcanisate, forming a pseudo-vulcanization. This can occur either during mixing and creep hardening or in storage and bin ageing.

Fumed silica has unique properties and is commonly added to liquids/coatings and solids to improve various properties. Fumed silica has chain-like particle morphology. In liquids, the chains bond together via weak hydrogen bonds forming a three dimensional network, trapping liquid and effectively increasing the viscosity. The effect of the fumed silica can be negated by the application of a shear force for example mixing, brushing, spraying etc., allowing the liquid to flow, level out and permit the escape of entrapped air.

One production method for the production of fumed silica involved a continuous flame hydrolysis technique. It involves the conversion of silicon tetra chloride ($SiCl_4$) to the gas phase using an oxy hydrogen flame. It then reacts with water to yield silica ($SiO_2$) and hydrochloric acid thus:

$$SiCl_4 + H_2O \quad SiO_2 + HCl$$

HCl can easily be separated as it remains in the gas phase, while $SiO_2$ is solid in the form of fumed silica.

Silicone can be in large variation of shapes and forms, such as thin sheets obtained by spun coating or spray coating, foil obtained by lamination or molding, bloc molded pieces, distributed silicone, silicone mixed with thermoplastic material.

The present invention provides a cured silicone layer which has a preferred thickness of 10 to 80 µm, preferably 20 to 40 µm. This layer contains laser-drawn traces up to 10 to 20 µm traces or pads with a dimension of 100 to 200 µm which are filled with metallized deposit.

The present invention further provides a silicone layer which has a preferred thickness of 15 to 25 µm. This layer contains laser-drawn traces having a width of to 10 to 20 µm which are filled with metallized deposit, preferably with Pt. This layer contains further a second 15 to 25 µm thick silicone layer covering the once metallized first silicone layer. After curing that second silicone layer an optimum silicone-to-silicone adhesion of the second silicone layer provides a fully protected cover to the metallized silicone layer. A full silicone-encapsulation of the once produced metal traces is thereby obtained.

The present invention provides overlapping silicones with different formulations. In the previous aspects of the present invention, silicones have a formulation that contains generally a variable amount of fumed silica (silica foam) that serves to strengthen the polymeric structure in various ways. It also favors the electroless-metallization process and improves substantially the mechanical behavior of metallized silicone. In this aspect of the present invention, the final silicone cover remains unmetallized and serves solely for the purpose of protecting and insulating the underlying metallized silicone layers. That silicone cover may be formed with a silicone that is different from the silicone that has been used for the underlying layers. In particular, it may not contain silica foam at all and may then be more readily applied even to very small layer thickness. Therefore, a silicone cover of 15 to 20 µm is formed on the metallized silicone layer. That silicone cover is formed with a silica foam free silicone that is spun onto the metallized silicone before curing as above.

In the metallization process a non-organic powder is dispersed in any given polymer, for example polyamide. The non-organic powder is for example at least one oxide of antimony, aluminum, iron, zinc or tin. The oxide particles have variable particle sizes, preferably smaller than about 50 µm. The concentration of the oxide particles in the polymer exceeds about 1 vol.-% or 1 wt.-%.

The surface of the polymer material is irradiated with the light beam emitted by a laser. The light is emitted preferably in the ultraviolet wavelength range, during a very short duration or pulse and repeated if necessary at regular time intervals. The pulsed emission has preferably high energy, for example, between 0.05 and 1.0 J. It contains a very large number of photons. It may also operate at a wavelength below or equal to about 350 nm which corresponds to photon energy approximately equal to or larger than 3.5 eV. The desired emission may be obtained from but is not restricted to an excimer laser source emitted during about 10 ns, at a wavelength of about 248 nm which corresponds to photon energy of 5.0 eV.

The laser beam may be passed through a mask having a specific geometry, and projected upon focalization onto the surface of the material to be treated. A desired processing is obtained beyond a given energy density of about 0.5 J/cm$^2$, or fluence, and as a function of the material optical properties and the laser photon energy.

In case of pure silicone, UV laser irradiation may produce two effects that depend on both fluence and photon energy.

At 248 nm, therefore at 5 eV, the silicone undergoes partial decomposition by breaking the Si—C bonds. This results in ablation of the C-radicals but leaves unaffected the Si—O bonds of the polymer backbone.

At lower wavelengths for example at 193 nm, therefore at 6.2 eV, the silicone undergoes total decomposition by breaking both Si—C and Si—O bonds. This results in a full ablation of silicone, typically at a rate of some 0.5 μm per pulse at 0.5 mJ/cm$^2$, and irrespective of the silicone formulation.

In the case of silicone containing silica, for example silica foam, the 248 nm laser radiation has no effect on the silica particles but the 193 nm does, which leads to a complete ablation of the silicone and its silica additive.

In the second part of the process, silicone treated with the 248 nm laser is immersed in an autocatalytic bath that contains metal ions, for example $Ni^{2+}$, $Cu^{2+}$, or $Pt^{2+}$. These ions are selectively driven to deposit and react on the partially decomposed silicone structure regardless if the treated silicone contains an additive, for example silica foam, or not. The reaction between metal ions and the polymer results in covalent bonding on the Si atoms of the polymer that lost their C-radicals upon irradiation. In the absence of silica foam, metallization occurs but with a poor adhesion of the metallized silicone part. The presence of silica foam enforces substantially the metallized silicone that is obtained after laser treating at 248 nm, since silica remains unaffected at 248 nm.

In contrast, irradiating silicone at 193 nm provides a very efficient way to fully and exclusively ablate silicone, containing silica foam or not. In particular, irradiating silicone at 193 nm allows opening clean and well defined cuts, grooves, blind holes or vias through it. Silicone parts engraved by 193 nm do not metallize by immersing in an autocatalytic bath.

During immersion of the laser processed surface into the autocatalytic bath, metallization is restricted to the actual laser treated surface. The incubation time measures the amount of time necessary to form a continuous metal film on the composite surface. After that time, the metal deposition, which is usually 10 to 20 μm per hour for Ni, may develop perpendicular to the surface in an efficient manner.

The advantages of the process of the present invention result directly from the use of an intense and pulsed ultraviolet light beam, as for instance the one emitted by an excimer laser source working at a wavelength equal or inferior to 308 nm. All other light sources working in the visible or infrared range, in pulsed or continuous regime are inactive on silicone.

The preferred irradiation source according to this invention is an excimer laser. The preferred excimer laser performs engraving at about 248 nm with partial decomposition of silicone and allows metallization. The laser pulse duration is about 1 to 40 ns by steady or scanning irradiation. In comparison, engraving below about 200 nm performs full ablation but no metallization can follow after such ablation.

A silicone layer is spun onto a clean glass plate or substrate and cured in an oven. The layer may have a near constant thickness at about 40 μm across the glass substrate. The thickness depends on spinning conditions and the content of additives. The higher the content of additives is the more difficult is the spinning. This layer is then scanned with a focused 248 nm excimer laser beam working at a sufficient fluence that allows partial decomposition of the silicone material down to some 10 to 15 μm into the layer. The laser processed silicone layer, on its glass substrate, is further immersed in an electroless bath containing metal ions. Subsequently, the latter ions condense solely on the laser-processed areas of the silicone layer where they contribute to form metallized deposits precisely in the laser-drawn areas and remain embedded in the silicone layer without touching the glass substrate underneath.

After preparing the metallized silicone layer on a glass substrate, a second 20 μm thick silicone layer is deposited on the once metallized first silicone layer and cured in oven. An optimum silicone to silicone adhesion of the latter is thus achieved that provides a fully protected cover to the metallized silicone layer. The set of two silicone layers may then be pulled from the glass substrate and materializes the full silicone-encapsulation of the once produced metal traces.

Silicones have a formulation that contains generally a variable amount of silica foam additive that serves to strengthen the polymeric structure in various ways. This additive or other form of silica for example fiber also favors the electroless-metallization process and improves substantially the mechanical behavior of metallized silicone. However, the final silicone cover remains un-metallized and serves solely the purpose of protecting the underlying metallized layers. That silicone cover may be formed with a silicone that is different from the one silicone that has been used for the other underlying layers. In particular, it may not contain silica at all and may then be more readily spun, even to very small layer thickness. Therefore, a silicone cover of 20 μm is formed on the last metallized silicone layer. That silicone cover is formed with a silica-free silicone that is spun onto the metallized silicone before curing as above.

The electroless Pt-metallization proceeds via forming a thin so-called black metal film and then goes on a second step of Pt-deposit that thickens the metal layer. That second step is extremely slow being impaired in particular with the formation of hydrogen bubbles on a quite uneven metallizing surface; bubbles that tend to obliterate the surface and limit its direct contacting to the electroless bath. Accelerating this second metallization step may be performed as follows.

After having initiated that second step, the silicone layer on its substrate is removed from the bath and its surface is blown for a few seconds with a hot air jet as produced by a standard air gun. The jet cleans up the surface and heats up the metal deposit. The layer is then returned to the bath for a period of 5 to 10 minutes before being removed again from the bath, re-blown as before and re-immersed in the bath. The process is repeated regularly (and automated eventually) at 5 to 10 minute intervals until the necessary metal thickness has been attained. With this transient heat procedure, time reduction from 2 to 3 hours to 30 minutes in the process of Pt-metallizing is substantial and the metal deposit may attain a large thickness that may not be accessible without it.

The present invention will be further illustrated by the following exemplary explanation of the FIGS., but it is to be understood that the invention is not meant to be limited to the details described herein. The figures explain the preferred process for producing a silicone layer containing embedded Pt traces.

FIGS. 1-1, 1-2, and 1-3 depict the sequence of process steps for manufacturing 1 to 4 levels of metallized silicone layer body. FIGS. 1-1, 1-2, and 1-3 show the process of producing a 4-level metallized silicone cable containing 4 layers of Pt-traces, all terminating with end Pt-pads on a silicone cover. It shows a sequence of repeating steps, FIG. 1-1 steps 1-5.

(1) Preparing a layer or mold containing silicone a;
(2) Laser engraving on the surface of the silicone b;
(3) Metallizing and preparing a trace c in the engraving b;
(4) Overlaying with a top silicone layer d;
(5) Drilling e and optionally engraving b2;
(6) Metallizing and preparing a trace c2 and a pad f.

The sequence can repeated in steps 7-17 until 4 layers of Pt traces are obtained with 4 pads g1-g4. The first level of polymer has a thickness of 30 to 70 µm, preferably of 45 to 55 µm. The metal trace has thickness of 1 to 20 µm, preferably of 5 to 15 µm. The overlaying polymer layer has a thickness of 20 to 40 µm, preferably of 25 to 35 µm. Thickness of the whole multilayer is of 150 to 200 µm, preferably of 170 to 190 µm. A 4-layer metallized silicone with silicone cover, containing traces on different individual layers but all terminated with pads on outer cover surface has a thickness of 215 to 245 µm, preferably of 225 to 235 µm. The pad ha a cross section of 160 to 230 µm, preferably of 190 to 210 µm.

FIG. 1A depicts a cross sectional view of one layer metallized silicone with a pad. It has a thickness of 90 to 110 µm and contains metallized silicone sheeting with silicone cover; traces are connected to pads on outer cover surface.

FIG. 2 depicts a cross section of visual prostheses. FIG. 2 shows a convex molded base silicone piece 1 with a radius of 10 to 15 mm, preferably 12 mm. Metallized planar silicone over layers 2 are provided on base silicone piece 1. A non-metallized silicone over 3 is provided on the top. Pt-vias 4 are laser-drilled through planar silicone over layers 3, contacting demux IC 7 on one end and contacting Pt-traces on the other end. A demux IC 7 is imbedded in base silicone piece 1. Platinum vias 5 are laser-drilled through silicone 1, contacting demux IC 7 on one end, and terminating on the other end with Pt-pads on curved silicone surface 1, these pads being designed for contacting retina. Pt-traces 6 are on the surface of each planar metallized silicone over layer. Silicone cable 8 contains embedded Pt-traces 6.

FIG. 3 depicts the back view of a visual prostheses as shown in FIG. 2. FIG. 3 presents imbedded back Pt-pads 9. Each pad 9 is connected to imbedded demux IC 7 and one trace 6 of imbedded Pt-traces. Silicone cable 8 contains Pt-traces 6.

FIG. 4 presents a front view of visual prostheses, FIG. 2. FIG. 4 shows open Pt-pads. Each of the open front Pt-pads 9 are connected by platinum vias 5 to demux IC 7 as shown in FIG. 2 and contact the retina.

Figure 5:
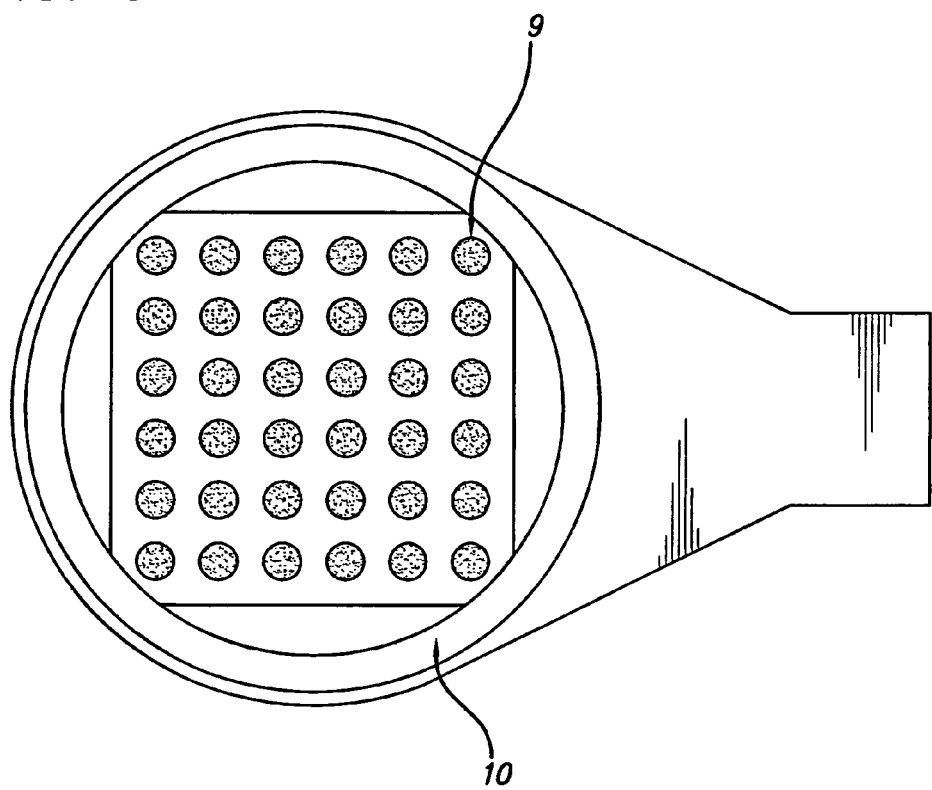
FIG. 5 depicts the front view of visual prostheses as shown in FIG. 2 to be attached to the retina by biological glue.

FIG. 5 depicts the front view a visual prosthesis, FIG. 2 to be attached to the retina by biological glue 10.

FIG. 6 depicts the front view of a molded silicone. The molded plano-convex silicone lens is shown before trimming edges; image shows convex surface. The cross section is between 6 and 12 mm, preferably between 7 and 9 mm.

FIG. 7 depicts the front view of a molded silicone as shown in FIG. 6 with electrodes. The cross section is between 2.8 and 3.4 mm, preferably 3.1 and 3.3 mm. It shows exemplary 427 Pt pads (about 100 µm diameter and about 100 µm spacing, regularly spaced over a 3.2 mm diameter area on top of a spherical silicone lens having a 12 mm radius.

FIG. 7A depicts a magnification of the metallized front view of a molded silicone as shown in FIG. 7 with 427 circular Pt pads on a molded silicone lens having about 100 µm diameter and about 100 µm spacing.

Figure 8:
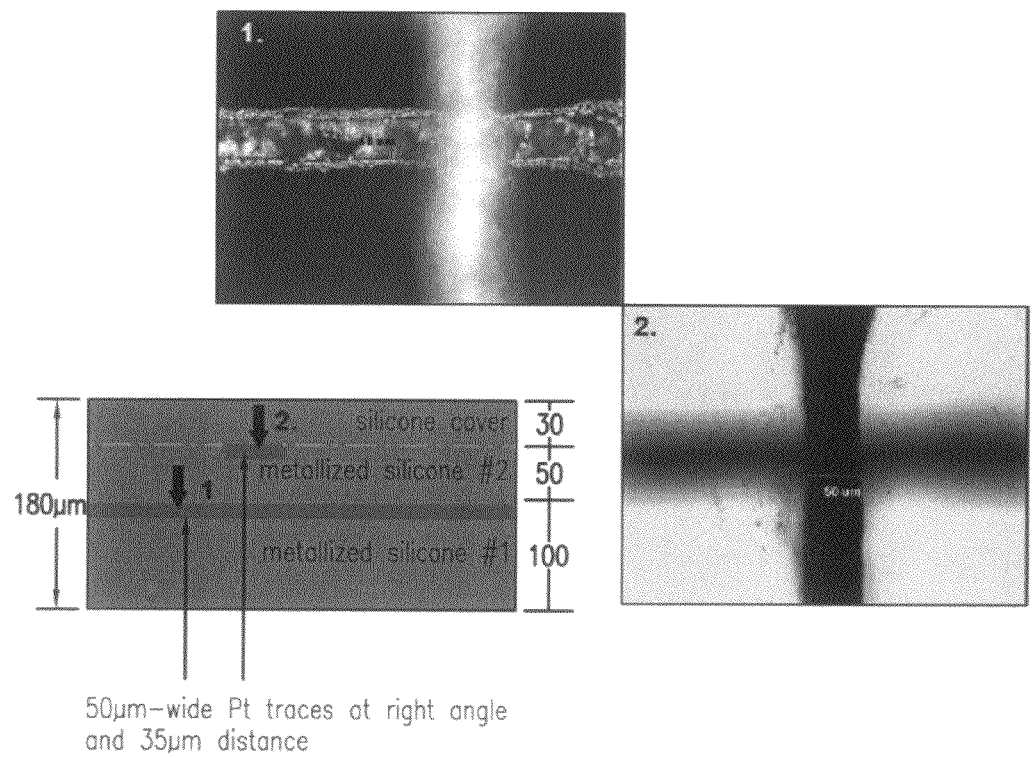
FIG. 8 depicts a cross-sectional view of a silicone layer with two metal trace layers; photomicrograph 1 shows the a top view on trace 1 and photomicrograph 2 shows a top view on trace 2.

FIG. 8 depicts a cross sectional view of a silicone layer with two metal trace layers; photomicrograph 1 shows the a top view on trace 1 and photomicrograph 2 shows a top view on trace 2. 2-layer metallized silicone with a thickness of 150 to 200 µm, preferably 170 to 190 µm, with silicone cover of about 30 to 70 µm, preferably 45 to 55 µm distance between Pt traces and about 40 to 60 µm, preferably 30 to 35 µm silicone between traces. The measured resistance is about R=16 Ω/cm. It shows 40 to 60 µm, preferably 45 to 55 µm wide Pt traces at right angle and 25 to 45 µm, preferably 30 to 40 µm distance. Photomicrograph 1 focuses on trace at bottom layer (R-light). Photomicrograph 2 focuses on trace at top layer (T-light).

Figure 9C:
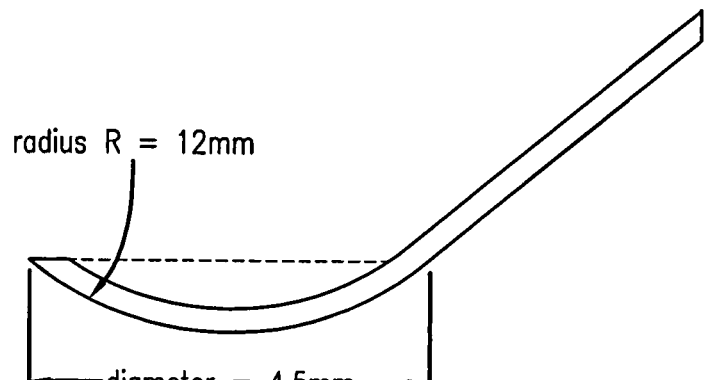
Figure 9D:
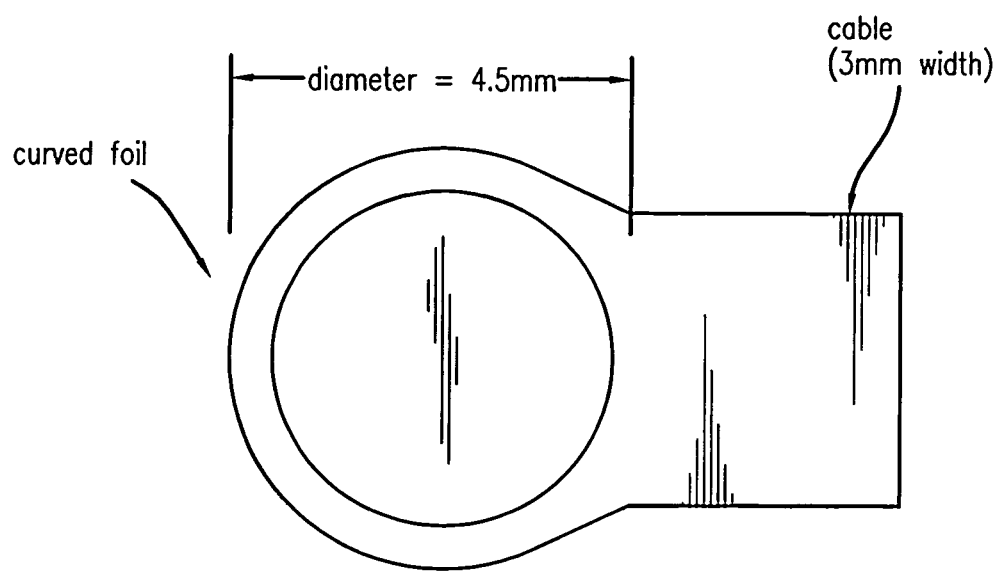
Figure 9E:
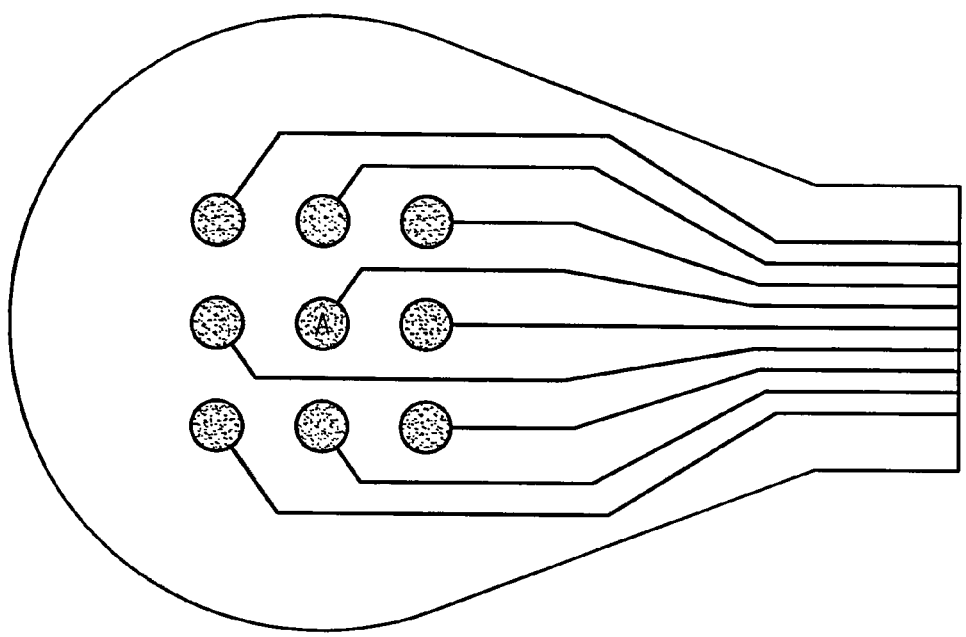
Figure 9F:
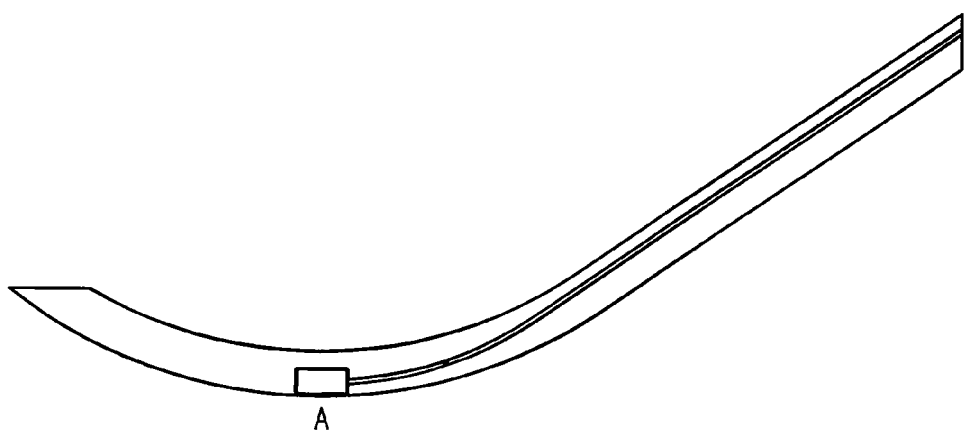

FIGS. 9A to 9F depict a sequence for manufacturing a curved metallized electrode array. FIG. 9a shows a cross sectional view of FIG. 9B along the dotted line and the step of molding silicone in between two $MgF_2$-coated glass mold pieces. Silicone is poured on to the base glass piece of the form and subsequently the top glass piece is mounted together with the base part. After silicone is cured at a temperature of 150° to 180° C., for 10 to 20 minutes, base and top glass pieces are separated yielding a silicone piece as shown in FIGS. 9C and 9D. The molded silicone is metallized. The metallizing method is carried out as described in previous sections. The curved metallized surface is covered with a layer of silicone using the same molding tool containing $MgF_2$-coated base and top glass pieces. The pad areas as shown in FIG. 9F are further opened by laser irradiation.

Examples of Producing a Molded Silicone Piece

1. Plano-Convex Lens

A plano-concave fused silica lens is coated with a $MgF_2$ thin layer on its concave face. The latter is filled with a silicone material that is appropriate for molding applications (i.e. containing silica foam). Filling should exceed the volume of the concave face. That silicone is further compressed with $MgF_2$-coated fused glass plate. Compression should be exerted along the optical axis of the lens in such a way that silicone would overflow over the lens edge. The two fused silica piece assembly containing silicone is maintained under compression while being brought into an oven for curing silicone. When curing is completed, the two fused silica parts are separated and the molded silicone piece (now forming a plano-convex lens) is extracted by easy pealing as allowed by the $MgF_2$ coatings that are present on the fused silica pieces.

The actual radius of the so molded plano-convex silicone lens equals the one of the plano-concave fused silica molding piece. That radius may be adjusted to any given value as a function of the foreseen application. In particular, it may be taken to equal the human eyeball radius of 10 to 15 mm, preferably about 12 mm. In that way, the whole curved (concave) surface of the silicone lens may be brought to precisely contact the human retina.

2. Concave-Convex Lens

A plano-concave fused silica lens, its concave surface having a radius R, is coated with a $MgF_2$ thin layer on its concave face. An annular spacer is positioned on the outskirt of the latter. The spacer is made of either metal or any dense polymeric material. Its thickness may be adjusted to any convenient value, e.g. 100 µm. The concave face of the lens is then filled with a silicone material that is appropriate for molding applications (i.e. containing silica foam). Filling should exceed the volume of the concave face. That silicone filling is further compressed with $MgF_2$-coated fused silica convex surface having the same radius of curvature R as the plano-concave lens above. In particular and advantageously, the latter may belong to a plano-convex lens.

Compressing silicone is performed until the compressing convex surface reaches the spacer surface. While maintaining compression, the assembly is placed in an oven to cure silicone. After curing is completed, the two lenses are separated and the molded silicone piece (now a thin molded silicone foil in the form of a double-sided convex-concave lens) is pealed from the $MgF_2$-coated fused silica surfaces. Further, edge trimming the above molded piece may be performed with an excimer laser at either 248 nm or, preferably, 193 nm. The goal of trimming is to cut out all unnecessary parts of the molded piece and fit its final geometry to the application requirements. The thickness of this molded silicone piece is equal to the spacer thickness. Upon any manipulation, it advantageously retains the integrity of its curved geometry. The actual radius, R, may be adjusted to equal the human eyeball radius. In so doing, the convex surface of the resulting trimmed curved silicone piece may be brought to intimately contact the retina.

After the molded silicone piece has been fabricated, its convex surface may be laser-processed to any necessary geometry and further metallized with pads and traces, as required by the application.

Further to the metallization, the resulting metallized piece is covered with a silicone layer. This covering step is performed in the following manner:

Plano-convex silicone piece:
the metallized silicone piece is positioned on a $MgF_2$-coated fused silica plate, its flat surface contacting the plate; an annular spacer is positioned around the molded piece; this spacer may be metallic or polymeric, its thickness is usually 50 μm but may be varied; the metallized, curved surface of the silicone piece is then covered with a drop of silicone; a $MgF_2$-coated concave lens having the same radius of curvature as the metallized silicone surface is now used to compress the silicone drop onto the molded silicone piece; compression is applied until reaching the spacer surface and further maintained while bringing the assembly into the oven for curing the silicone cover; after curing is completed, the whole silicone piece, imbedding the metallized parts as above, is separated from the two fused silica parts; lastly, laser edge-trimming the resulting silicone piece is performed to adjust its geometry.

Concave-convex silicone piece:
the metallized silicone piece is placed on a $MgF_2$-coated convex fused silica lens having the same radius of curvature R as its (non-metallized) concave surface, the latter facing the convex surface of the lens; an annular (metallic or polymeric) spacer is positioned on the edge of the opposite (metallized) surface of the silicone piece; the latter is then covered with a drop of silicone; a $MgF_2$-coated concave fused silica lens having a radius of curvature R is now used to compress the silicone drop onto the metallized surface of the silicone piece; compression is applied till reaching the surface of the spacer, and further maintained while bringing the assembly in an oven for curing the silicone cover; after curing, the whole molded silicone piece, now imbedding metallized parts, is pealed from the fused silica parts and edge-trimmed by laser.

Advantageously, both for simplicity and for a perfect adequation of the materials in contact, the same silicone material may be used for the base substrate (to be laser-processed and further metallized) and the cover. Identically, the same curing procedure is advantageously applied for both the silicone base and its cover. In so doing, a perfect integration of the assembled silicone piece is achieved that guarantee the most perfect imbedding of the metallized parts.

Further, the above cover layer may now be laser-processed and metallized along traces and pads as above, again covered with a new layer of silicone that can be laser-processed, metallized and silicone-covered as many times as necessary. The process has been extended to the production of a curved, multi-layered metallized silicone structure, containing a stack of either identical or diversified metallized silicone layers, all being covered with a final plain silicone film. Each individual silicone layers in the stack has typically a thickness of 50 μm, except for the last (un-metallized) silicone cover with a thickness of 30 μm.

$MgF_2$-coated fused-silica lenses (either spherical or cylindrical) are standard market products that are used in all ultraviolet optical settings. Since their surfaces are polished to perfection, the above described fabrication offers excellent (crystal-clear) cost-effective silicone products that can be widely adapted to the application. Other means of molding may be devised that would not depart from the above procedures, in particular using custom-made ($MgF_2$-fused silica or metal) molds.

Example of Protective Coating

Upon laser-irradiation with a pulsed ultraviolet laser source (e.g., an excimer laser source at 248 nm), silicone may be decomposed partially. Along with this irradiation step, residue of the decomposition may be ejected from the laser-processed areas and land lateral to these areas. Such residue consists of broken molecular segments of the polymeric silicone material, and are, therefore, rich in structural defects. These defects are as many electrically active atomic sites that may fix chemically metal ions during immersion of the laser-processed silicone in an electroless autocatalytic solution of the type used for metallizing the laser-processed silicone areas. When these residue are present during the immersion step, metallization would follow on areas that would not correspond to the desired specific areas that have been laser-processed. Therefore, these defects must be removed from silicone after laser-irradiation and before immersion in a metallization bath. This removal step may be performed by depositing, on silicone and before laser-irradiation, a film of material that may be removed from the silicone surface after irradiation and carried away. To be useful, the deposition of the film as well as its removal should not alter by any means (chemical or physical) the silicone surface. This is achieved by disposing a film of soap onto silicone.

a solution of soap is first formed by dissolving soap in water. After adjusting the viscosity of the solution, a film of soap is formed by knife-coating a silicone layer. Upon drying off, a film of soap is formed with a thickness of 2 μm all over the silicone surface. Laser-irradiation of the soap-coated silicone layer is then performed along a trace of 20 μm width. Residue are ejected on both sides of the trace, up to 50 μm from its edges and agglomerate on the soap film. The silicone piece is then washed thoroughly with distilled water. The soap film is dissolved and all residues are carried away by water streaming. The silicone piece is thus cleaned of these residue and the actual laser-processed trace remains devoid of lateral defects. Upon immersion in an electroless metallization solution, metallization is restricted solely to the actual trace width that was cut by the laser beam.

Example of Retinal Contact Lens Process Method

Each pad that is facing the retina needs be polarized, Increasing the number of pads has the direct consequence of increasing the number of traces that are due to traverse the eyeball, as well as to increase power supply and heat generation.

A way to reduce that number of traces (by x1/4) is to use a de-multiplexing integrated circuit (Demux) within the eyeball. A molded silicone lens may be used to that end.

This follows a precise description of the integration of an IC into a molded silicone lens:

the curved space of a concave $MgF_2$-coated fused silica lens (radius of curvature equal to 12 mm, the human eyeball radius) is filled with silicone; an integrated circuit (IC), coated with an $SiO_2$ insulating coating, is pressed into the silicone filling along the axis of the lens; a further covering of the IC is performed with silicone; finally a $MgF_2$-coated fused silica plate is pressed onto silicone along the lens axis; while compression maintained, the assembly is placed in an oven for curing silicone; after curing is completed, the cured silicone piece, now imbedding the IC, is recovered by separating the silica pieces; that silicone piece has one curved (convex) surface and one flat surface;

This follows laser-processing of the silicone piece that contains the IC and adapting it to forming a retinal implant.

vias (e.g. 50 μm in diameter, at 300 μm pitch) are driven through the convex silicone surface and through the IC $SiO_2$ coating down to the Si surface of the IC by using the beam of a 193 nm excimer laser source; these vias are Pt-metallized by electroplating; they are further equipped with 200 μm-diameter end-pads that are produced by 248 nm laser-irradiation of the curved silicone surface; these pads are further Pt-metallized via electroless autocatalytic metallization;

using the same 193 nm excimer laser source, vias are driven through the flat silicone layer that covers the other side of the IC; these vias are metallized via electroplating; traces are further drawn onto that silicone layer and connected to these vias; these traces are metallized via electroless metallization and form a set of traces on the same flat silicone surface;

another layer of silicone is deposited on the flat silicone surface that contains the traces; that layer may serve as a protective cover to the above set of metal traces; alternatively, it may also be further laser-processed and metallized with a new series of traces that connect each to a new via onto the IC surface underneath. The procedure may be repeated as many times as necessary to fully interconnect all the pads that are present on the curved surface of the piece.

Example for Metallization of Silicone

1. Protective Coating with Soap

A silicone sheet (NuSil MED 4950 from NUSIL TECHNOLOGY LLC, Carpinteria, Calif.) having a thickness of 80 μm was knife coated with a 2 μm thick soap layer.

2. Removal of Soap Protective Coating:

The silicone sheet was rinsed in de-ionized water several times to dissolve the soap layer and allowed to dry.

3. Metallization

A silicone sheet was mounted on a glass cylinder. The glass with the silicone sheet was immersed in the same metallizing solution being in a temperature controlled vessel for 3 to 5 hours. From time to time (e.g., at 10 minute intervals), hydrogen bubbles are eliminated from the sheeting by vibrating the cylinder or by heat flashing the silicone sheet. The silicone sheet was rinsed in distilled water at the end of the procedure.

Soap coating allowed removal of irradiation residues that were generated during irradiation and would in the event sediment laterally to the irradiated areas.

Step-two glass cylinder and the temperature controlled vessel were specifically designed for this purpose. The present invention provides the metallizing of an expanded silicone layer for enhanced metal imbedding. A silicone is applied on a glass cylinder. After inscribing the laser-processed traces on the convex, expanded silicone surface, the silicone layer on the glass cylinder is brought in an electroless Pt bath for metallization of the traces. The metallized silicone layer is detached from the glass cylinder and recovers its original planar geometry. The expanded Pt-traces contract enclosing the metal parts into silicone and providing an enhanced integration of these traces into the silicone layer. The once-expanded Pt-traces at time of their production contract and enclose the metal parts in the silicone providing an enhanced integration of these traces in the silicone layer.

While the invention has been described by means of specific embodiments and applications thereof, it is understood that numerous modifications and variations could be made thereto by those skilled in the art without departing from the spirit and scope of the invention. It is therefore to be understood that within the scope of the claims, the invention may be practiced otherwise than as specifically described herein.

What we claim is:

1. A process of manufacturing a curved flexible electrode array, comprising:
    molding a plano-convex lens containing silicone;
    irradiating a convex surface of said lens yielding traces with a light beam emitted by a pulsed ultraviolet laser source;
    immersing said irradiated convex surface of said lens in an autocatalytic bath thereby inducing the deposition of metal ions on said irradiated convex surface of said lens thereby forming metal traces;
    applying a layer containing silicone on said lens and forming a body enveloping said metal traces and the lens;
    irradiating said an outer surface of said body to cause drilling of vias in said body, exposing said metal traces and forming an irradiated body;
    immersing said irradiated body in said autocatalytic bath to induce a deposition of metal ions in said vias thus forming metal electrode pads; and
    wherein said irradiated body in combination with said metal electrode pads forms is said flexible electrode array.

2. The method according to claim 1, wherein said light beam irradiating said convex surface of said lens employs a wavelength between 170 and 350 nanometers.

3. The method according to claim 2, wherein said light beam is focused by a focusing optical system, said focused light beam having a diameter equal to or greater than 10 micrometers at said surface of said molded lens.

4. The method according to claim 1, further comprising thermal processing said irradiated body in a microwave oven and selectively heating said metal traces thereby inducing metal atoms of said metal traces to diffuse into said lens.

5. The method according to claim 1, further comprising coating said plano-convex lens with a protective coating prior to said irradiation.

6. The method according to claim 5, wherein said protective coating is soap.

7. A method of manufacturing a flexible electrode array, comprising:
    forming a molded plano-convex lens containing silicone within a mold;
    irradiating a convex surface of said lens yielding traces with a light beam emitted by a pulsed ultraviolet laser source;
    immersing said convex surface of said lens in an autocatalytic bath thereby inducing a deposition of metal ions on said traces and forming metal traces on said convex surface;
    applying a first layer containing silicone on said lens and on said metal traces forming a first body;

irradiating a surface of said first body to form second traces and cause drilling of vias into said first body, exposing said metal traces, immersing said irradiated first body in an autocatalytic bath to induce a deposition of metal ions in said vias and on second traces to form second metal traces and metal vias, applying a second layer containing silicone on said first body and on said second metal traces and on said metal vias forming a second body, irradiating a surface of said second body to cause drilling of vias into said second body, exposing said second metal traces, immersing said irradiated second body to induce a deposition of metal ions in said second vias to form second metal vias and electrode pads, and where said irradiated first layer, said second layer and lens in combination with said first metal traces, said second metal traces metal electrode pads forms said flexible electrode array.

8. The method according to claim 7, further comprising a step of coating said first layer with a protective coating before immersion in said autocatalytic bath to enable residue removal.

9. The method according to claim 8, wherein said protective coating soap.

* * * * *